(12) United States Patent
Tsai et al.

(10) Patent No.: US 6,586,876 B2
(45) Date of Patent: Jul. 1, 2003

(54) ORGANIC LIGHT-EMITTING DEVICE

(75) Inventors: Rung-Ywan Tsai, Tao-Yuan Hsien (TW); Chia-Shy Chang, Hsinchu (TW); Ching-Ian Chao, Hsinchu (TW); Mu-Yi Hua, Miao-Li Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/861,528

(22) Filed: May 22, 2001

(65) Prior Publication Data

US 2002/0094422 A1 Jul. 18, 2002

(30) Foreign Application Priority Data

Jan. 18, 2001 (TW) ........................... 90101090 A

(51) Int. Cl.$^7$ .................................................. H01J 1/62
(52) U.S. Cl. ...................... 313/509; 313/506; 428/426; 428/428; 428/432; 428/446; 428/448; 428/457; 428/469; 428/472; 428/688; 428/689; 428/697; 428/699; 428/701; 428/702
(58) Field of Search ................................. 428/212, 428, 428/432, 448, 697, 699, 701, 702, 426, 446, 457, 469, 472, 688, 689; 313/505, 509

(56) References Cited

U.S. PATENT DOCUMENTS

| | | |
|---|---|---|
| 4,885,211 A | 12/1989 | Tang et al. |
| 5,834,893 A | 11/1998 | Bulovic et al. |
| 5,844,363 A | 12/1998 | Gu et al. |
| 5,936,347 A * | 8/1999 | Isaka et al. .................. 313/506 |
| 6,124,024 A * | 9/2000 | Hosokawa et al. ........... 257/98 |
| 6,355,393 B1 * | 3/2002 | Hirai et al. .................... 355/32 |

OTHER PUBLICATIONS

G. Gustafsson et al., "The plastic LED: a flexible light–emitting device using a polyaniline transparent electrode," synthetic Metals 55–57, 4123–4127 (1993) (no month).
G. Gu et al., "High–external–quantum–efficiency organic light–emitting devices," Optics Letts., vol. 22, No. 6, 396–398 (1997) (Mar.).

* cited by examiner

Primary Examiner—Deborah Jones
Assistant Examiner—Andrew T Piziali
(74) Attorney, Agent, or Firm—Rabin & Berdo, P.C.

(57) ABSTRACT

The present invention relates to an organic light-emitting device which provides an electroluminescence (EL) or photoluminescence (PL) device with high external quantum efficiency. The present invention forms a composite film layer with continuously changing refraction indices between an ITO transparent electrode and a substrate made of plastic or glass. The refraction index of the composite film layer is the same as the ITO electrode at the interface with the ITO electrode. It decreases along the direction perpendicular to the substrate in a linear or nonlinear way. The refraction index is the same as that of the plastic or glass at the interface with the substrate. This way can avoid reflection due to the difference in the refraction index across the interface. The excited light originally trapped in the ITO electrode can be guided outwards. A preferred mean is to incorporate a photon wave guide formed at the interface between the substrate and the air to increase the external quantum efficiency of this type of organic light-emitting devices.

20 Claims, 9 Drawing Sheets

| LAYER | GLASS | 1 | 2 | 3 | 4 | 5 | 6 | 7 | 8 | 9 | 10 |
|---|---|---|---|---|---|---|---|---|---|---|---|
| n | 1.52 | 1.52 | 1.55 | 1.585 | 1.628 | 1.653 | 1.737 | 1.765 | 1.816 | 1.832 | 1.90 |
| Thickness (nm) | | 10.3 | 27.2 | 29.3 | 31.3 | 31.6 | 30.1 | 28.7 | 24.8 | 22.7 | 13.6 |

FIG. 3C

ORGANIC LIGHT-EMITTING DEVICE

BACKGROUND OF THE INVENTION

1. Field of Invention

The present invention relates to an organic light-emitting device. In particular, the invention relates to an organic electroluminescence (EL) or photoluminescence (PL) device that has higher external quantum efficiency by forming a composite film layer with a gradually varying refraction index between an ITO transparent electrode and a transparent substrate.

2. Related Art

After the first high efficiency green-light organic electroluminescence (EL) device developed by Kodak in 1987 (see the U.S. Pat. No. 4,885,211), organic EL devices have been receiving a lot of attention. The action principle of the organic EL devices is to sandwich an organic thin film between an anode and a cathode so that oppositely charged carriers (electrons and holes) will be driven by a electric field and meet in the organic layer and emit photons.

The structure of a simple two-layer organic EL device is shown in FIG. 1. A transparent ITO conduction electrode 20 (which is the anode with a thickness of 30 nm to 400 nm and a surface resistance less than 100 $\Omega/cm^2$) is coated on the surface of a plastic (acrylic, epoxy, polyethylene terephthalate (PET), polycarbonate (PC), etc) or glass substrate 10 as a hole injection electrode. One or several organic light-emitting layers 30 are then coated onto the transparent ITO conduction electrode 20. Another metal conduction electrode 40 (which is the cathode of about 100 nm to 400 nm thick and contains such metals as Mg, Li, Al, Ca, Ag, In and their alloys) is further coated onto the organic light-emitting layer 30 as an electron injection electrode layer. Owing to the difference in materials used for the organic light-emitting layer 30, the organic EL devices can be roughly classified into molecule-based organic EL devices and polymer-based organic EL devices. The coating methods of the organic light-emitting layer for these two types of organic EL devices are different. The former usually has a double layer structure. For example, the technology disclosed in the U.S. Pat. No. 5,844,363 uses a hole transport layer, N,N'-diphenyl-N,N'-(m-tolyl) benzidine (TPD), and an electron transport layer, tri-(8-hydroquinoline) aluminum (Alq3), each with a thickness of about 80 nm. The two layers are coated on the ITO film by vacuum vapor deposition. The polymer-based organic EL device uses a single layer of poly(2-methoxy-5-(2'-ethyl-hexyloxy)-p-phenylene vinylene (MEH-PPV) with a thickness of about 50 nm to 100 nm. This layer is coated on the ITO or a camphor sulfonic acid (CSA) doped polyaniline (PANI) film by spin coating, soak coating, scraping, screening or ink jet printing (G. Gustafson et al., "The 'plastic' LED: a flexible light-emitting device using a polyaniline transparent electrode," Synthetic Metals 55–57, 4123–4127(1993)).

As indicated in the report by G. Gu et al. in "High-external-quantum-efficiency organic light-emitting devices," Optics Letts., 396–398 (1997), the external quantum efficiency of photoluminescence (PL) or EL by either molecule-based organic EL devices or polymer-based organic EL devices is extremely low (about 17.5%). The main reason is that 51% and 31.5% of the light emitted from the organic EL layer are trapped within the ITO electrode and the glass substrate, respectively. This is caused by the reflection and total reflection due to the refraction index difference between the ITO electrode (n=1.9) and the plastic or glass substrate (n=1.52), where the critical angle for total reflection is 53.1 degrees, and the refraction index difference between the plastic or glass substrate and the air (n=1), where the critical angle for total reflection is 41.1 degrees.

Therefore, how to lead the light from the interior of a molecule-based organic EL device or polymer-based organic EL device to outside so as to increase the external quantum efficiency of the PL or EL, and thus lowering the power consumption and increase the product lifetime, is a big research subject in the field.

In the U.S. Pat. No. 5,834,893 (V. Bulovice et al., "High efficiency organic light emitting devices with light directing structures"), the disclosed technology is to make reflective mirrors with different shapes on the surface of a plastic or glass substrate. The reflective light trapped in the molecule-based organic EL layer, the polymer-based organic EL layer, or the ITO transparent conduction layer can escape out of the device surface because the reflected light has an incident angle smaller than the critical angle for total reflection at the interface. Nevertheless, the problem is such geometrical structures will change the incident (reflective) angle of the excited light. Therefore, the efficiency is limited and the emitted light may have an inhomogeneous intensity distribution.

SUMMARY OF THE INVENTION

It is a primary objective of the present invention to provide an organic electroluminescence (EL) or photoluminescence (PL) device with high external quantum efficiency.

It is another objective of the present invention to provide a photon wave guide device that can improve the external quantum efficiency of organic EL or PL devices and the corresponding structure.

The technologies proposed herein try to solve the problem of inferior external quantum efficiency of organic light-emitting devices with a transparent ITO electrode and using glass or plastic as the substrate material. To avoid the reflections at the interface between the ITO electrode and the plastic or glass substrate for the light emitted from the organic EL layer and the luminescence loss due to the reflection at the interface between the plastic or glass substrate and the air, the present invention inserts a composite film layer with a gradually varying refraction index between the ITO electrode and the plastic or glass substrate. The composite film layer is made of materials with two different refraction indices so that the refraction index change is compatible with the ITO electrode and the plastic or glass substrate. In other words, the refraction index of the composite film layer is the same as that of the ITO electrode (n=1.9) at their interface and gradually changes along the direction perpendicular to the substrate in a linear or non-linear way (such as a stair-shape curve). The refraction index of the composite film layer finally becomes the same as that of the substrate (n=1.49 to 1.6 for plastic and n=1.52 for glass) at their interface. This design can avoid reflection due to the refraction index difference across the interface. Accordingly, the excited radiation originally trapped in the ITO electrode can then be led outside the device.

In another preferred embodiment of the invention, a photon wave guide is provided at the interface between the substrate and the air to increase the external quantum efficiency of such organic EL or PL devices.

BRIEF DESCRIPTION OF THE DRAWINGS

The present invention will become more fully understood from the detailed description given hereinbelow illustration only, and thus are not limitative of the present invention, and wherein:

FIG. 3C shows the change of the refraction index of a $TiO_2$—$SiO_2$ composite film layer in FIG. 3A with the thickness of each film layer;

DETAILED DESCRIPTION OF THE INVENTION

Figure 2:
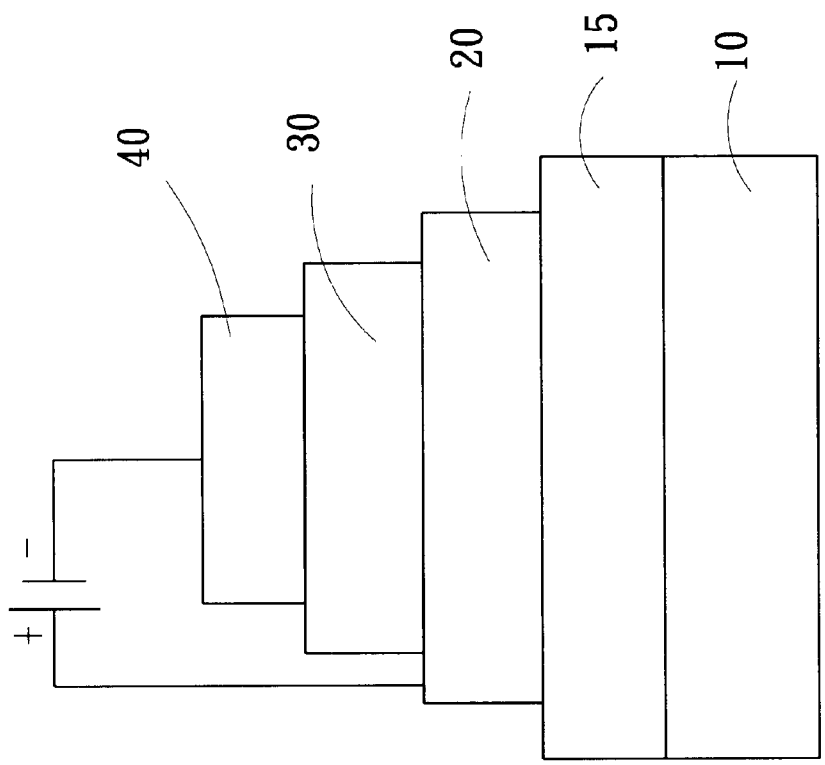
FIG. 2 shows a cross-sectional view of an organic light-emitting device of the invention.
Figure 1:
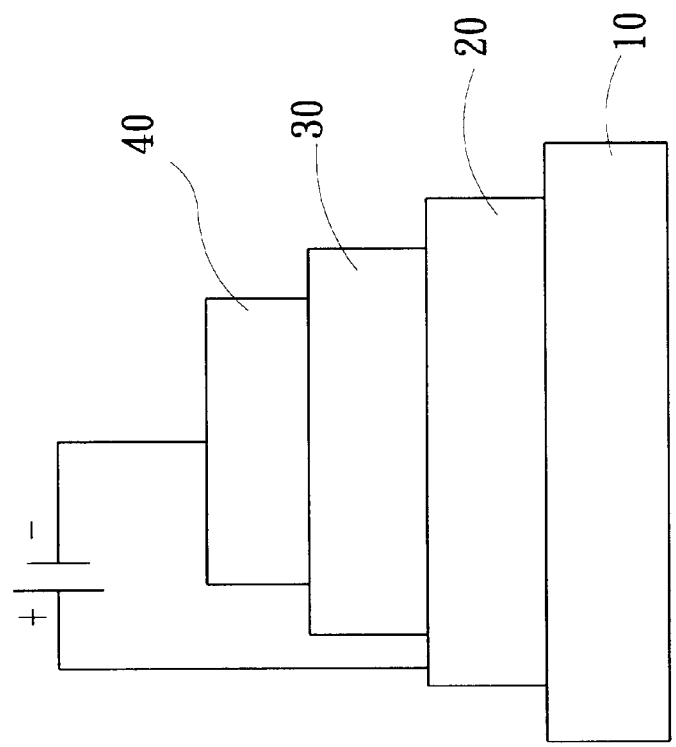
FIG. 1 shows a cross-sectional view of a conventional organic EL device.

As shown in FIG. 2, the disclosed organic light-emitting device is a molecule-based or polymer-based organic electroluminescence (EL) or photoluminescence (PL) device uses plastic, such as acrylic, epoxy, polyethylene terephthalate (PET), polycarbonate (PC), etc, or glass to form a substrate 10 and has a transparent ITO electrode 20 (as the anode). FIG. 2 uses a simple two-layer organic EL device to demonstrate a preferred embodiment structure of the invention. The structure shown in the drawing also includes an organic light-emitting layer 30 and a metal conduction electrode 40 (as the cathode) formed in order on the ITO electrode 20.

To avoid the luminescence loss caused by reflection at the interfaces between the ITO electrode 20 and the plastic or glass substrate 10 and between the substrate 10 and the air, a composite film layer 15 with a gradually varying refraction index is inserted between the ITO electrode 20 and the substrate 10. The change in the refraction index of the composite film layer 15 is compatible with the refraction indices of the ITO electrode 20 and the substrate 10. In other words, the refraction index of the composite film layer 15 is the same as that of the ITO electrode 20 (n=1.9) at their interface and gradually decreases along the direction perpendicular to the substrate 10 in a linear (such as the continuous curve in FIG. 4) or nonlinear way (such as the stair-shape curve in FIG. 3B) across the composite film layer 15. The refraction index of the composite film layer 15 finally becomes the same as that of the substrate 10 (n=1.49 to 1.6 for plastic and n=1.52 for glass) at their interface. This design can avoid reflection due to the refraction index difference across the interface. Accordingly, the excited radiation originally trapped in the ITO electrode 20 can be led out of the device.

The composite film layer 15 with a gradually varying refraction index is made by mixing materials with two different refraction indices (such as the $TiO_2$—$SiO_2$ composite film). The composite film layer 15 is then coated between the substrate 10 and the ITO electrode 20 by low-temperature (<100° C.) ion-assisted electron beam coevaporation or simply coevaporation. This method is extremely good for the subsequent evaporation of the ITO electrode 20 and is applicable for temperature-sensitive plastic 10. Materials with a high refraction index include $ZrO_2$, $TiO_2$, $Ta_2O_5$, and $Nb_2O_5$ that have a refraction index greater than 1.8. Materials with a low refraction index include $SiO_2$, $MgF_2$, and $CaF_2$ that have a refraction index smaller than 1.5.

Figures 3A, 3B:
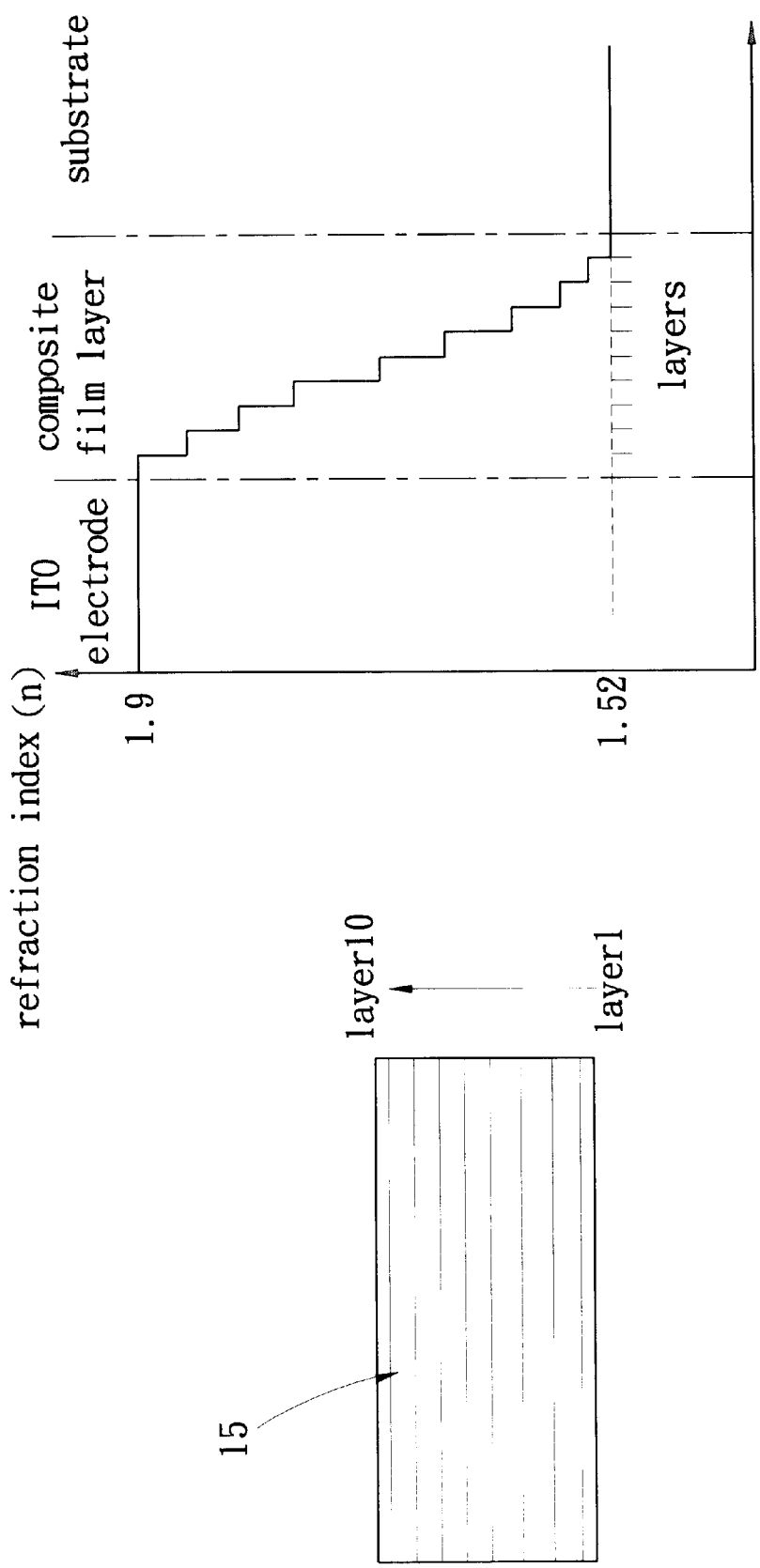
FIG. 3A shows a cross-sectional view of a composite film layer with a gradually varying refraction index.
FIG. 3B shows the curve of a nonlinearly varying refraction index in FIG. 3A.
Figure 4:
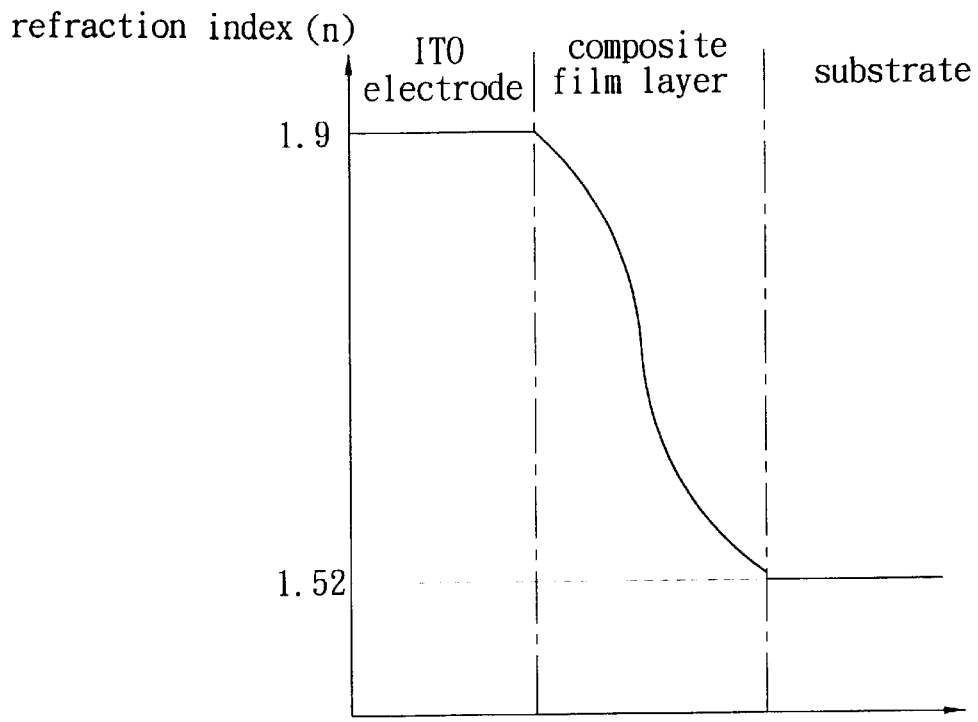
FIG. 4 shows another embodiment compound layer with a continuously varying refraction index.

Microscopically, the composite film layer 15 is a multi-layer structure (each layer in the multi-layer structure will be referred as a film hereinafter). Taking the composite film layer 15 made of $TiO_2$—$SiO_2$ as an example (FIG. 3A), although each film contained therein (layer 1 through layer 10) consists of the same material $TiO_2$—$SiO_2$, the thickness and the ingredient ratio of $TiO_2$ and $SiO_2$ are controlled so as to give a gradually varying refraction index. This type of refraction index change is as the nonlinear stair-shape curve shown in FIG. 3B. The relation between refraction index of the $TiO_2$—$SiO_2$ composite film layer 15 and the thickness of each film is shown in FIG. 3C. Of course, if the number of films in the multi-layer composite film layer 15 is increased, the refraction index versus thickness curve will get closer to the linear continuous curve as shown in FIG. 4.

The manufacturing process of the $TiO_2$—$SiO_2$ composite film layer 15 is as follows: the raw materials for evaporation are $Ti_2O_3$ tablets and $SiO_2$ grains. The raw materials of the ITO electrode 20 are $In_2O_3$—$SnO_2$ tablets, wherein $SnO_2$ occupies 10% by weight. To control the composition of $TiO_2$—$SiO_2$ so as to obtain the desired variable refraction index, the evaporation rate of $TiO_2$ is fixed at 0.2 nm/s while that of $SiO_2$ is controlled between 0.2 nm/s to 2 nm/s. The reaction gas is a mixture of Ar (purity >99.99%) and $O_2$ (purity >99.99%). The fluxes of both gases are controlled to be 18 ml (i.e., 18 sccm) and 30 ml, respectively. The discharge voltage and discharge current of the plasma beam is 100V and 40A, respectively. Therefore, the plasma source energy is about 90 eV. The detailed procedure of coating the $TiO_2$—$SiO_2$ composite film layer 15 is given in, for example, R.-Y. Tsai et al., "Influences of the deposition rate on the microstructure and hardness of composite films prepared by reactive ion-assisted coevaporation," Opt. Eng. 34, 3075–3082 (1995).

Since ion collision does not increase the temperature of the substrate 10 significantly, the heat source of the complete manufacturing process is from the evaporation source. It is found from experiments that the temperature increase is less than 60° C. in the film coating process. Therefore, it does not have any influence on the PET plastic material and the same manufacturing process can be applied to other temperature-sensitive plastic materials.

Figure 5:
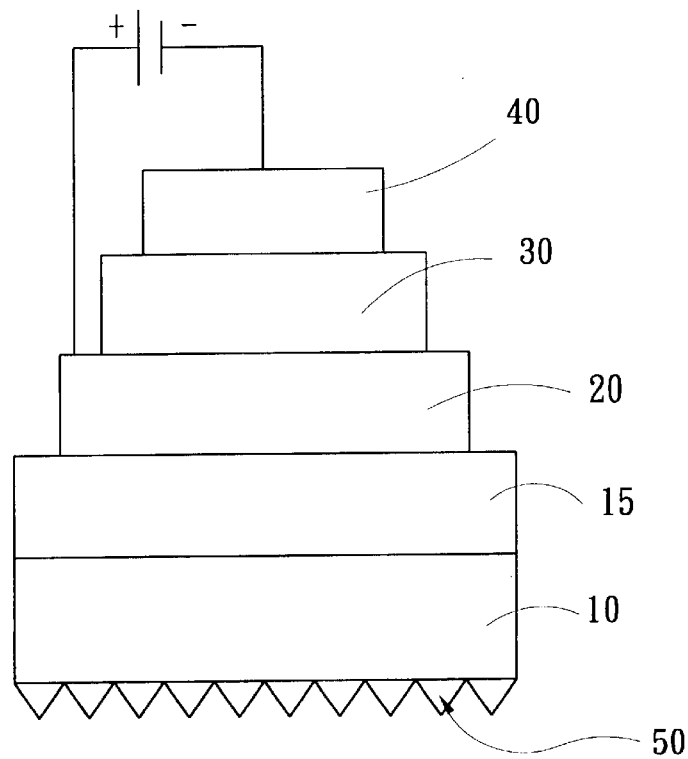
FIG. 5 shows another embodiment structure of the disclosed organic light-emitting device.

In another preferred embodiment of the invention, a photon wave guide device 50 is provided at the interface of the substrate 10 and the air (FIG. 5) to guide the excited radiation trapped in the glass or plastic substrate 10 outwards.

Figure 6B:
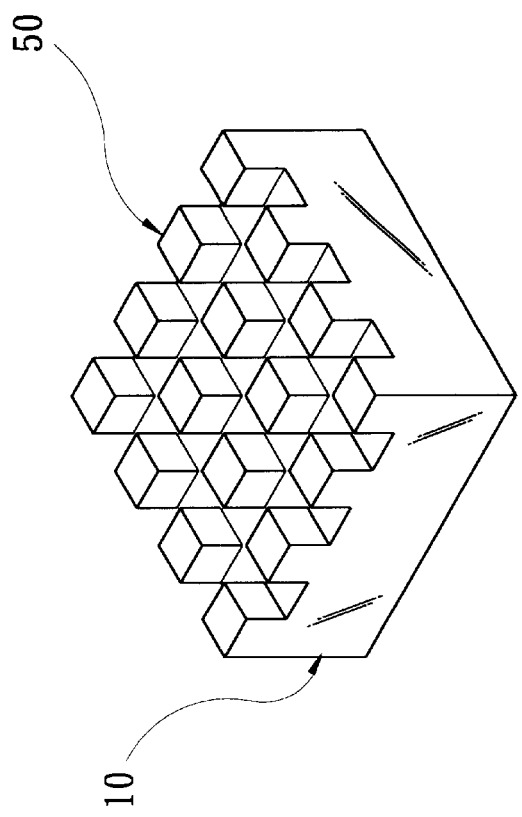
FIGS. 6A through 6D show several embodiment structures of the photon wave guide formed on the substrate.
Figure 6A:
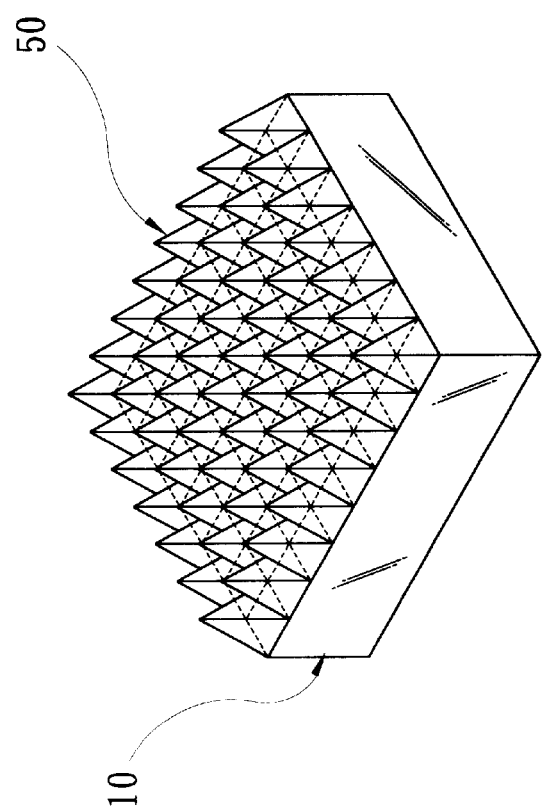
Figure 6D:
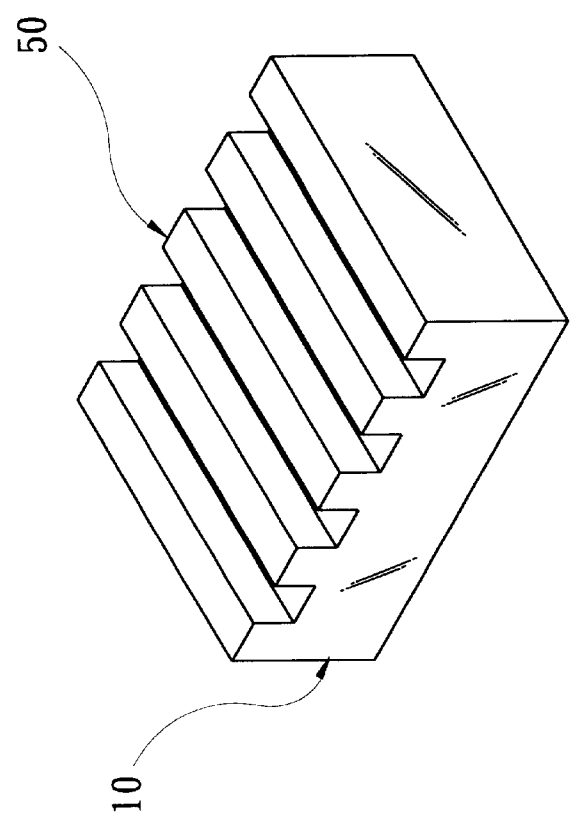
Figure 6C:
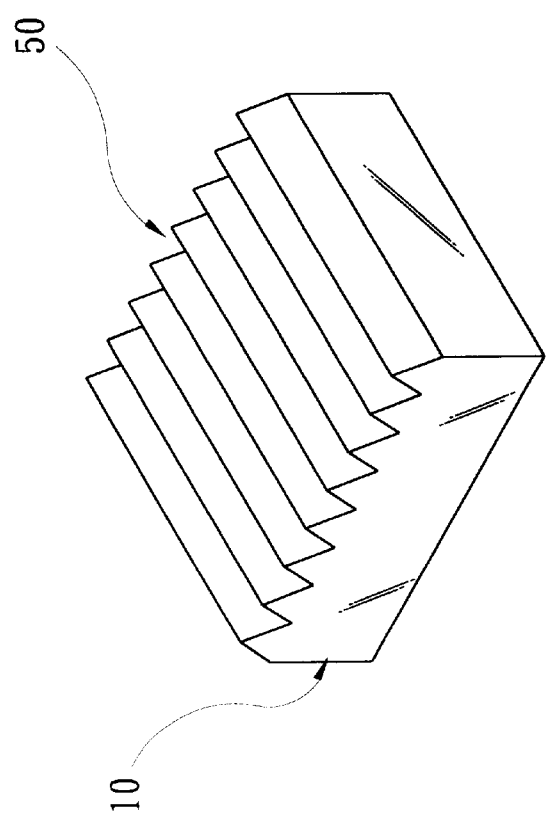

A first embodiment of the photon wave guide 50 is shown in FIG. 6A. It is composed of several pyramids disposed along one dimension. It can be composed of several cubes disposed in a periodic pattern (FIG. 6B), several triangular ridges disposed in parallel (FIG. 6C), several rectangular ridges disposed in parallel (FIG. 6D), or a regular photon wave guide device 50 of any other geometric shape. The periodic length should be smaller than the wavelength of visible light (about 300 nm to 400 nm). The effective refraction index gradually decreases from the substrate 10 toward the air along the direction perpendicular to the substrate 10.

Figure 7A:
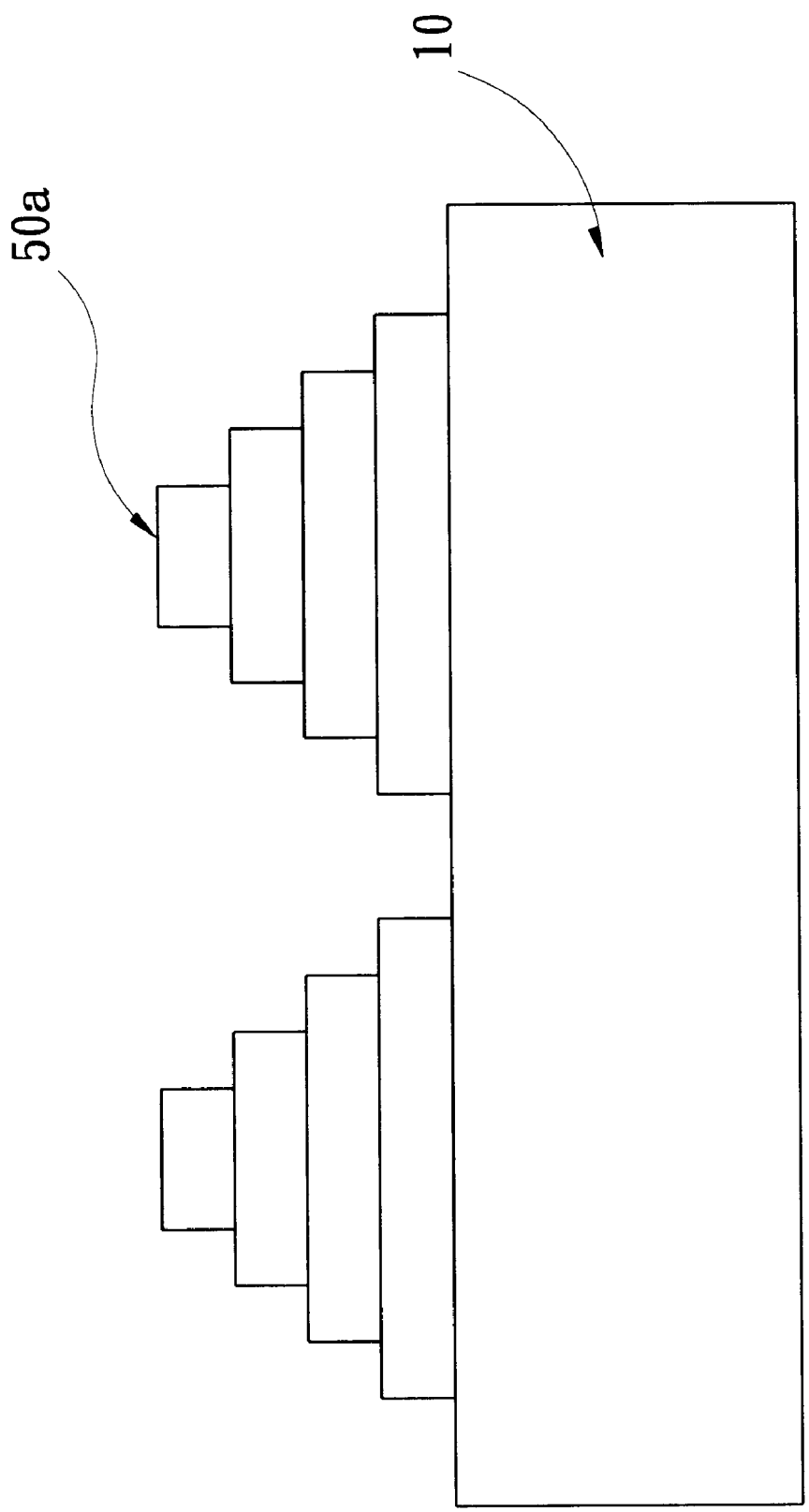
FIG. 7A shows another embodiment structure of the photon wave guide formed on the substrate.
Figure 7B:
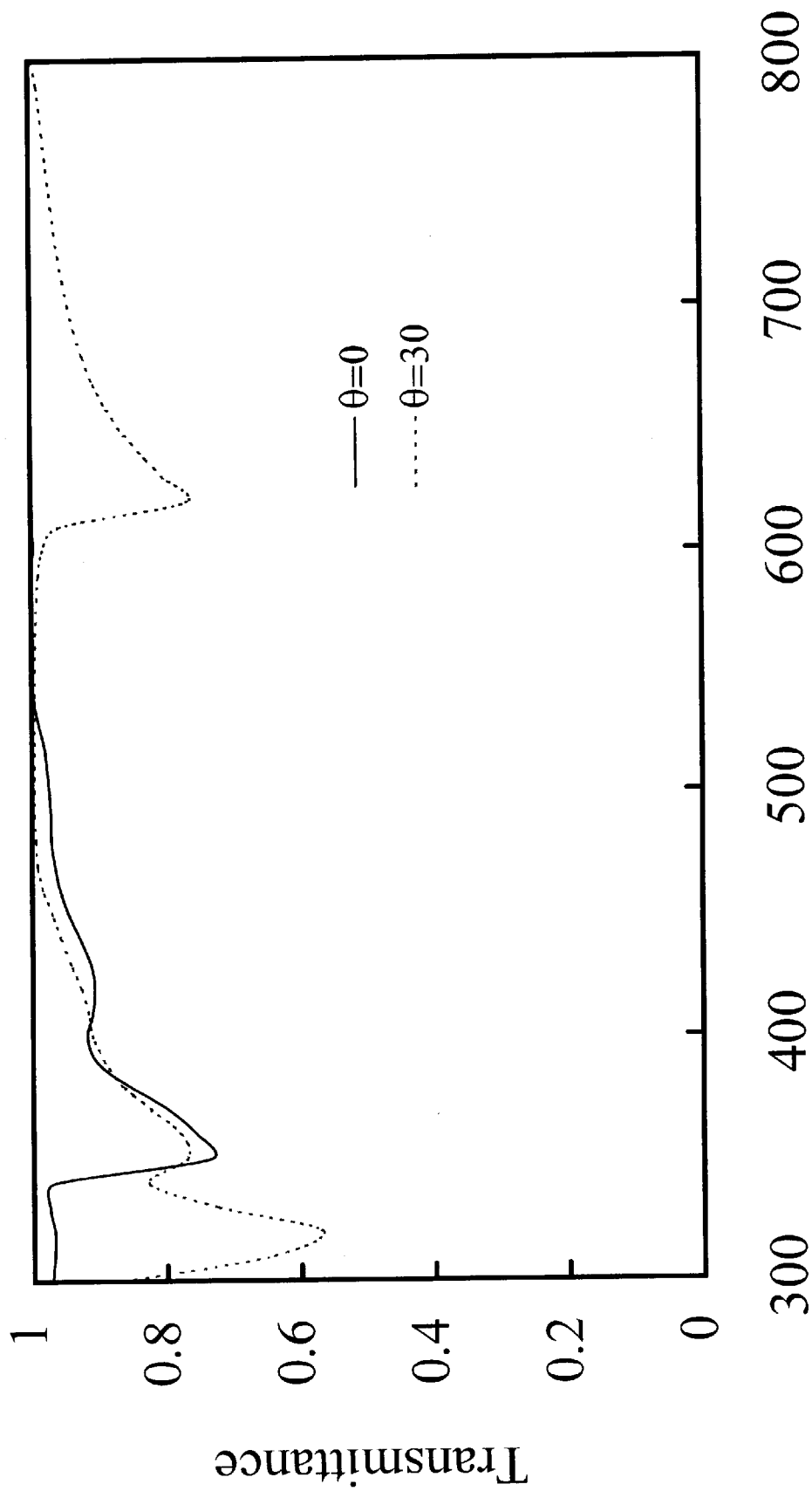
FIG. 7B shows a transmission spectrum of FIG. 7A.

With reference to FIG. 7A, the photon wave guide 50a is a binary photon wave guide device 50a by stacking rectangular blocks in a tower shape. The width of each block in such a binary photon wave guide device 50a decreases in the direction away from the substrate 10. A preferred arrangement of the widths of the rectangular blocks to the spectrum periodic length is 80%, 60%, 40%, and 20% in sequence from bottom to top. The efficiency curve of guiding trapped light out of the substrate 10 is shown in FIG. 7B. When the incident angle is 0 degree toward the photon wave guide device 50a, the efficiency is close to 100%. Even when the incident angle is 30 degrees, there is still a high guiding efficiency.

The photon wave guide device 50 is pressed and printed on the plastic substrate 10 by thermal roll pressing or made by reactive ion beam etching along with gray scale masking. As the photon wave guide device 50 is directly formed by printing or etching on the substrate 10, there will be no incompatibility problem in the adhesive force and the thermal stress between the photon wave guide device 50 and the substrate 10.

In the manufacturing process, the photon wave guide device 50 with a periodic length is formed on the lower surface of the substrate 10 according to the above means.

Figure 8:
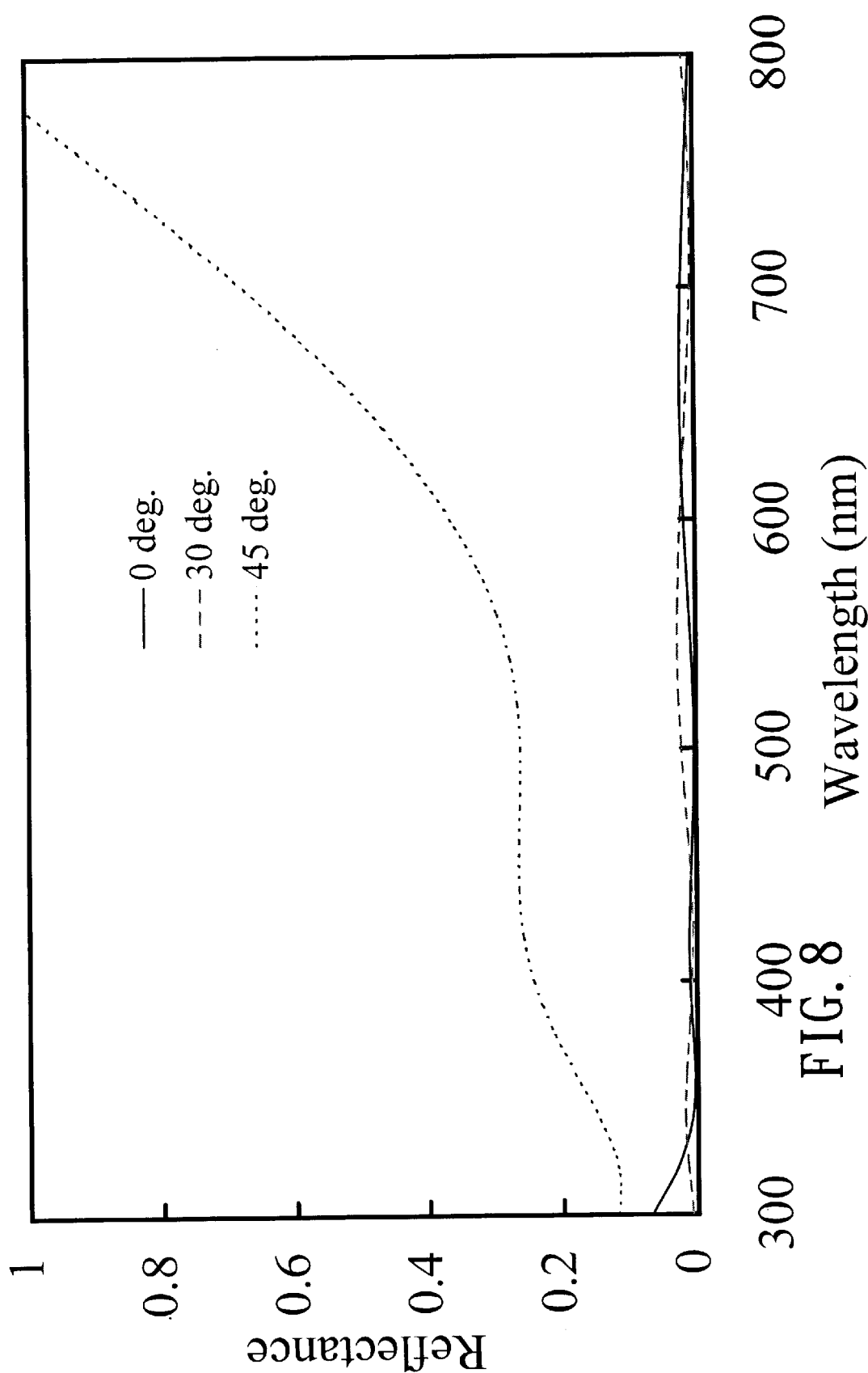
FIG. 8 shows the reflective spectrum of perpendicular visible light according to the invention.

The upper surface of the substrate 10 is coated with a composite film layer 15 (such as the $TiO_2$—$SiO_2$ composite film layer) with a gradually varying refraction index using ion-assisted electron beam coevaporation or cosputtering at room temperature. The percentage of $TiO_2$ contained in the composite film layer 15 increases linearly or nonlinearly as the thickness increases so that the refraction index of the composite film layer 15 is the same as that of the ITO electrode 20 (n=1.9) at their interface and the same as that of the substrate 10 (n=1.49~1.6 for plastic and n=1.52 for glass). This design can completely avoid reflections caused by the refraction index difference across the interfaces. The $TiO_2$—$SiO_2$ composite film layer 15 has a thickness preferably between 200 nm and 1000 nm. Secondly, the same method is employed to deposit a transparent conduction ITO film 20 with a thickness of about 30 nm to 400 nm and a surface resistance less than 100 $\Omega/cm^2$ in the same vacuum chamber. A display electrode pattern can be formed on the transparent conduction ITO film 20 by etching, if a display pattern is to be formed on the conduction plastic substrate 10. Afterwards, one or several layers of molecule-based light-emitting materials 30 are coated thereon by thermal evaporation. One or several layers of metal layers 40 are subsequently coated thereon as an electron injection electrode by thermal evaporation. This then completes the manufacturing of the disclosed organic EL or PL device. As shown in FIG. 8, the light originally trapped inside the ITO electrode 20 can be led out of the device by the $TiO_2$—$SiO_2$ composite film layer 15 with a stair-shape refraction index coated between the ITO electrode 20 and the substrate 10. The reflection rate of the excited radiation is almost 0% when its incident is smaller than 30 degrees. Even when the incident angle is 45 degrees, the reflection rate is still extremely low in the visible light range.

Effects of the Invention

1. The present invention inserts a composite film layer (such as $TiO_2$—$SiO_2$) with a gradually varying refraction index between the ITO electrode and the substrate. This can effectively prevent excited radiation from the organic EL or PL device from being trapped within the ITO electrode, thus increasing the external quantum efficiency of the organic light-emitting device.
2. The present invention uses a composite film layer (such as $TiO_2$—$SiO_2$) with a gradually varying refraction index along with a photon wave guide device formed at the interface between the substrate and the air to increase the external quantum efficiency of such types of organic light-emitting devices.
3. The composite film layer (such as $TiO_2$—$SiO_2$) with a gradually varying refraction index disclosed herein can effectively avoid the influence of water and oxygen in the plastic material, prevent alkaline metals and other impurity atoms or ions released by the glass substrate from entering the ITO electrode or the organic light-emitting layer. Therefore, the photoelectric property of the organic EL or PL device can be maintained and the device lifetime will be longer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An organic light-emitting device comprising:
   a substrate, which is light-transmitting;
   a transparent ITO electrode, which is above an upper surface of the substrate as an anode;
   a composite film layer with a gradually varying refraction index, which is sandwiched between the substrate and the transparent ITO electrode, and whose refraction indices at the two interfaces are substantially the same as those of the ITO electrode and the substrate, respectively, as it varies along the direction perpendicular to the substrate;
   an organic light-emitting layer, which is formed on the ITO electrode; and
   a metal conduction electrode, which is formed on the organic light-emitting layer.

2. The device of claim 1, wherein the substrate is a glass substrate.

3. The device of claim 1, wherein the substrate is a plastic substrate.

4. The device of claim 3, wherein the plastic substrate material is selected from the group comprising acrylic, epoxy, polyethylene terephthalate (PET), and polycarbonate (PC).

5. The device of claim 1, wherein the substrate further has a photon wave guide at an interface that is exposed to air, the photon wave guide being directly formed on a surface of the substrate and its effective refraction index decreasing along a direction perpendicular to the substrate from the substrate to the air.

6. The device of claim 5, wherein the photon wave guide is composed of a plurality of pyramid objects disposed along one dimension.

7. The device of claim 5, wherein the photon wave guide is composed of a plurality of cubic objects disposed periodically along one dimension and the periodic length is smaller than the wavelengths of visible light.

8. The device of claim 5, wherein the photon wave guide is composed of a plurality of triangular ridges disposed in parallel.

9. The device of claim 5, wherein the photon wave guide is composed of a plurality of rectangular ridges disposed in parallel and periodically and the periodic length is smaller than the wavelengths of visible light.

10. The device of claim 5, wherein the photon wave guide is composed of a plurality of geometrical objects disposed periodically.

11. The device of claim 5, wherein the photon wave guide is pressed and printed on the substrate by thermal roll pressing.

12. The device of claim 5, wherein the photon wave guide is made by reactive ion beam etching along with gray scale masking.

13. The device of claim 1, wherein the composite film layer with a gradually varying refraction index is a mixture of two materials with different refraction indices.

14. The device of claim 13, wherein one of the materials is a high refraction index material that is selected from the group consisting of $ZrO_2$, $TiO_2$, $Ta_2O_5$, and $Nb_2O_5$, whose refraction indices are all greater than 1.8.

15. The device of claim 13, wherein one of the materials is a low refraction index material that is selected from the group consisting of $SiO_2$, $MgF_2$, and $CaF_2$, whose refraction indices are all smaller than 1.5.

16. An organic light-emitting device, comprising:
    a light-transmitting substrate having a predetermined refraction index;
    a light-transmitting anode electrode having a refraction index that is different from the refraction index of the substrate, the anode electrode being spaced apart from the substrate;
    a composite film layer sandwiched between the substrate and the anode electrode so as to have an interface with the substrate and an interface with the anode electrode, the composite film layer having a refraction index that varies, in a direction perpendicular to the substrate, from a first value adjacent the interface with the substrate to a second value adjacent the interface with the anode electrode, the first value being substantially the same as the refraction index of the substrate and the second value being substantially the same as the refraction index of the anode electrode;
    an organic light-emitting layer on the anode electrode; and
    a cathode electrode on the light-emitting layer,
    wherein the composite film layer is a multi layer structure composed of a plurality of films made of at least two materials with different refraction indices, and the refraction index of the composite film layer varies as a function of the thickness of each film and the composition ratio of the at least two materials therein.

17. The device of claim 16, wherein each film in the composite film layer is formed between the substrate and the anode electrode using low-temperature ion-assisted electron beam coevaporation.

18. The device of claim 16, wherein each film in the composite film layer is formed between the substrate and the anode electrode by coevaporation.

19. The device of claim 16, wherein the refraction index of the composite film layer is a linear function of its thickness.

20. The device of claim 16, wherein the refraction index of the composite film layer is a stair-shape function of its thickness.

* * * * *